(12) United States Patent
Ikemoto

(10) Patent No.: US 9,793,600 B2
(45) Date of Patent: Oct. 17, 2017

(54) WIRELESS COMMUNICATION MODULE AND COMMUNICATION TERMINAL APPARATUS INCORPORATING THE SAME

(71) Applicant: Murata Manufacturing Co., Ltd., Nagaokakyo-shi, Kyoto-fu (JP)

(72) Inventor: Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/292,439

(22) Filed: Oct. 13, 2016

(65) Prior Publication Data

US 2017/0033444 A1 Feb. 2, 2017

Related U.S. Application Data

(63) Continuation of application No. 14/277,074, filed on May 14, 2014, now Pat. No. 9,496,597, which is a
(Continued)

(30) Foreign Application Priority Data

Feb. 1, 2012 (JP) ................................. 2012-019836

(51) Int. Cl.
*H01Q 7/06* (2006.01)
*H01Q 1/24* (2006.01)
(Continued)

(52) U.S. Cl.
CPC ......... *H01Q 1/243* (2013.01); *G06K 7/10237* (2013.01); *G06K 19/07722* (2013.01); *G06K 19/07749* (2013.01); *G06K 19/07784* (2013.01); *H01Q 1/2208* (2013.01); *H01Q 1/2283* (2013.01); *H01Q 7/06* (2013.01); *H04B 5/0031* (2013.01); *H04B 5/0081* (2013.01); *H03H 2001/0085* (2013.01)

(58) Field of Classification Search
CPC .... H01Q 1/2208; H01Q 1/2283; H01Q 1/243; H01Q 7/06
See application file for complete search history.

(56) References Cited

U.S. PATENT DOCUMENTS 8,143,988 B2 * 3/2012 Hamano ............. H01F 17/0013
336/200
8,884,721 B2 * 11/2014 Mizoguchi ............... H03H 7/09
333/185

FOREIGN PATENT DOCUMENTS

JP 2006319223 * 11/2006 ............ H01F 17/00
JP 2009015574 * 1/2009 ............ G06K 17/00

OTHER PUBLICATIONS

Ikemoto, "Wireless Communication Module and Communication Terminal Apparatus Incorporating the Same", U.S. Appl. No. 14/277,074, filed May 14, 2014.

* cited by examiner

*Primary Examiner* — Hoang Nguyen
(74) *Attorney, Agent, or Firm* — Keating & Bennett, LLP

(57) ABSTRACT

A wireless communication module includes a multilayer structure including a magnetic block and at least one non-magnetic layer stacked on the magnetic block, the magnetic block including at least one magnetic layer, at least one inductor element disposed at the magnetic block, and an antenna coil disposed at the non-magnetic layer so as to overlap the inductor element in a planar view along a stacking direction of the non-magnetic layer with respect to the magnetic block, wherein the magnetic layer is present between the inductor element and the antenna coil.

9 Claims, 9 Drawing Sheets

Related U.S. Application Data continuation of application No. PCT/JP2013/050966, filed on Jan. 18, 2013.

(51) Int. Cl.
*H04B 5/00* (2006.01)
*G06K 7/10* (2006.01)
*G06K 19/077* (2006.01)
*H01Q 1/22* (2006.01)
*H03H 1/00* (2006.01)

WIRELESS COMMUNICATION MODULE AND COMMUNICATION TERMINAL APPARATUS INCORPORATING THE SAME

BACKGROUND OF THE INVENTION

1. Field of the Invention

The present invention relates to a wireless communication module capable of radiating a high frequency signal from an antenna coil, and a communication terminal apparatus including such a wireless communication module.

2. Description of the Related Art

Conventionally, an authentication technology by use of wireless communication such as RFID (Radio Frequency Identification)) is widely used in logistics management, credit transactions, and the like. In a RFID system, wireless communication is performed between a reader-writer and a RFID tag or a contactless IC card. This wireless communication enables the reader-writer and the RFID tag or the like to exchange data stored therein.

Further, as one of near-field wireless communication standards, there is a NFC (Near Field Communication) that uses a 13 MHz band frequency. It is hoped that NFC may be implemented in communication terminal apparatuses such as cellular phones and the like. For example, prevalence of NFC may allow a user to easily perform data transfer or data exchange only by moving his/her communication terminal apparatus close to a reader-writer provided at a shop to establish wireless communication between these two devices. Thus, NFC is now being studied to develop various applications such as contactless credit transactions and the like.

As a conventional example of devices that perform the foregoing wireless communication, there is a contactless tag described in Japanese Unexamined Patent Application Publication No. 2001-188890. This contactless tag is capable of recording received data and transmitting recorded data, and includes an antenna section for performing transmission and reception of data, an IC chip for processing data, and an impedance matching circuit for performing impedance matching between the antenna section and the IC chip.

Further, in some cases, a low pass filter (hereinafter, referred to as LPF) including an inductor element may be provided between the IC chip and the antenna section to suppress radiation of unwanted harmonics from the antenna section.

However, when an attempt is made to unify the antenna section and the inductor element of the LPF together and form a single module, there is a problem that magnetic coupling is formed depending on their spatial relationship and unwanted harmonics are radiated from the antenna section.

SUMMARY OF THE INVENTION

Preferred embodiments of the present invention provide a wireless communication module capable of significantly reducing or preventing unwanted harmonic radiation, and a communication terminal apparatus including such a wireless communication module.

According to a preferred embodiment of the present invention, a wireless communication module includes a multilayer structure including a magnetic block and at least one non-magnetic layer stacked on the magnetic block, the magnetic block including at least one magnetic layer; at least one inductor element disposed at the magnetic block; and an antenna coil disposed at the non-magnetic layer so as to overlap the inductor element in a planar view along a stacking direction of the non-magnetic layer with respect to the magnetic block, wherein the magnetic layer is present between the inductor element and the antenna coil.

According to another preferred embodiment of the present invention, a wireless communication module includes a multilayer structure including a magnetic block and at least one non-magnetic layer stacked up in a preset direction with respect to the magnetic block that defines and serves as a reference, the magnetic block including at least one magnetic layer; first and second inductor elements disposed at the magnetic block; and an antenna coil disposed at the non-magnetic layer so as to overlap the first and second inductor elements in a planar view along the preset direction, wherein the magnetic layer is present between the inductor element and the antenna coil.

According to yet another preferred embodiment of the present invention, a communication terminal apparatus includes the wireless communication module according to one of the other preferred embodiments of the present invention.

According to still another preferred embodiment of the present invention, a wireless communication module includes a multilayer structure including a magnetic block and at least one non-magnetic layer stacked up in a preset direction with respect to the magnetic block that defines and serves as a reference, the magnetic block including at least one magnetic layer; at least one inductor element disposed at the magnetic block; an antenna coil disposed at the non-magnetic layer so as to overlap the inductor element in a planar view along the preset direction; and a shield conductor disposed between the inductor element and the antenna coil.

According to a further preferred embodiment of the present invention, a communication terminal apparatus includes the wireless communication module according to one of the preferred embodiments described above.

Various preferred embodiments of the present invention provide a wireless communication module capable of significantly reducing or preventing unwanted harmonic radiation, and a communication terminal apparatus including such a wireless communication module.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a reader-writer module that serves as an example of a wireless communication module according to a preferred embodiment of the present invention is described in detail with reference to FIG. 1 to FIG. 3.

Figure 1:
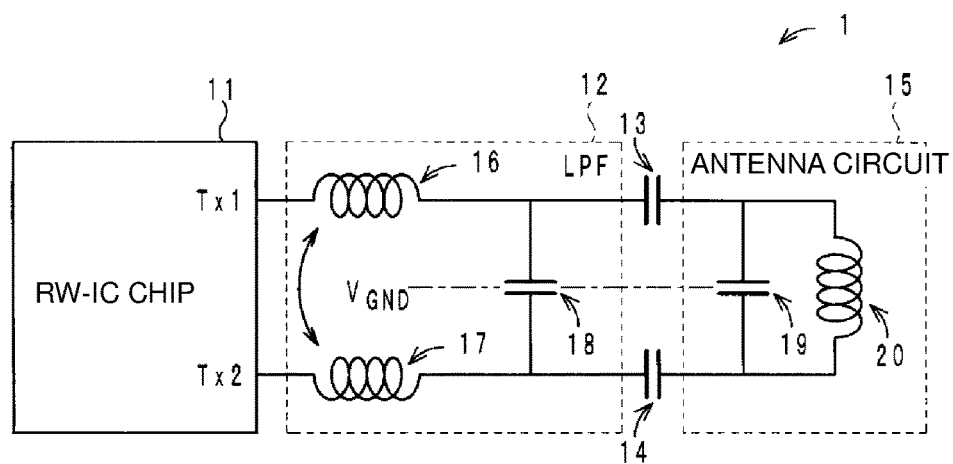
FIG. 1 is a circuit diagram illustrating a configuration of reader-writer module (RW module).

First, referring to FIG. 1, a circuit configuration of a reader-writer module 1 that serves as an example of wireless communication module is described. In FIG. 1, the reader-writer module 1 (hereinafter, referred to as 'RW module') complies with a wireless communication standard such as, for example, NFC. For example, when a RFID tag or a contactless IC card is brought close to the RW module 1, the RW module 1 performs wireless communication with the RFID tag or the like. Therefore, the RW module 1 includes a RW-IC chip 11, a low pass filter (hereinafter, referred to as LPF) 12, first and second capacitor elements 13 and 14, and an antenna circuit 15.

The RW-IC chip 11 includes balance-type output terminals Tx1 and Tx2. In the RW-IC chip 11, a baseband signal to be transmitted to a communication counterpart of the present RW module 1 is converted to a transmission signal (non-inverted signal) at a preset high frequency band (for example, 13 MHz band) by a preset digital modulation method. Further, in the RWIC chip 11, an inverted signal, whose phase is rotated by 180 degrees with respect to the non-inverted signal, is also generated. The non-inverted signal and the inverted signal define a differential signal. The differential signal is outputted from the RW module-IC chip 11 to the LPF 12. Specifically, the non-inverted signal is outputted from one of the output terminals, Tx1, and supplied to a first inductor element 16 whereas the inverted signal is outputted from the other output terminal Tx2 and supplied to a second inductor element 17.

Here, the RW-IC chip 11 may also define and function as a feed circuit that processes a high frequency signal received through the antenna circuit 15 or that transmits a preset high frequency signal to an antenna coil of the antenna circuit 15, and may convert a received signal of the antenna circuit 15 to a baseband signal by the foregoing digital modulation method.

The LPF 12 filters an outputted differential signal of the RW-IC chip 11 to pass only a low frequency component whose frequency is equal to or less than a preset frequency, and outputs it to the antenna circuit 15. This makes it possible to remove an unwanted harmonic component and prevent the harmonic component from being radiated from the antenna circuit 15. For removal of the harmonic component, in the example of FIG. 1, the LPF 12 includes the first and second inductor elements 16 and 17 and a capacitor element 18. The first inductor element 16 is connected in series between one of the output terminals of the RW-IC chip 11, Tx1, and one of terminal electrodes of the first capacitor element 13. The second inductor element 17 is connected in series between the other output terminal of the RW-IC chip 11, Tx2, and one of terminal electrodes of the second capacitor element 14. The capacitor element 18 is electrically connected between an output terminal electrode of the first inductor element 16 and an output terminal electrode of the second inductor element 17.

Further, in the LPF 12, the first and second inductor elements 16 and 17 define a common mode choke that removes common mode noise that may be superposed on the non-inverted signal and the inverted signal. Thus, the first and second inductor elements 16 and 17 are wound the same number of turns but in opposite directions. Further, the first and second inductor elements 16 and 17 preferably have a symmetric spatial arrangement with respect to each other about an electrical midpoint, namely, a virtual ground $V_{GND}$ that defines and serves as a reference. Here, in the LPF 12, the electrical midpoint is located at the capacitor element 18.

The first and second capacitor elements 13 and 14 eliminate direct current components included in an outputted non-inverted signal and an outputted inverted signal from the LPF 12, and output to the antenna circuit 15.

The antenna circuit 15 preferably is a parallel resonance circuit including a tuning capacitor element 19 and an antenna coil 20. The outputted non-inverted signal of the first capacitor element 13 is inputted to one of terminal electrodes of this parallel resonance circuit, and the outputted inverted signal of the second capacitor element 14 is inputted to the other terminal electrode. The tuning capacitor element 19 preferably includes a ceramic multilayer capacitor having a fixed capacitance value or a capacitor element having a variable capacitance value. The antenna coil 20 preferably includes, for example, a thin film coil or a multilayer coil having a fixed inductance value.

Values of respective elements of the antenna circuit 15 preferably are designed so as to resonate at a frequency of the 13 MHz band when the RW module 1 complies with NFC, for example. This enables to radiate a high frequency signal at the 13 MHz band from the antenna coil 20 toward an antenna coil (not illustrated) installed at a communication counterpart side. As a result, the antenna coil 20 defines a magnetic coupling with the antenna coil of the communication counterpart side, and a communication counterpart receives a radiated high frequency signal.

Figure 2:
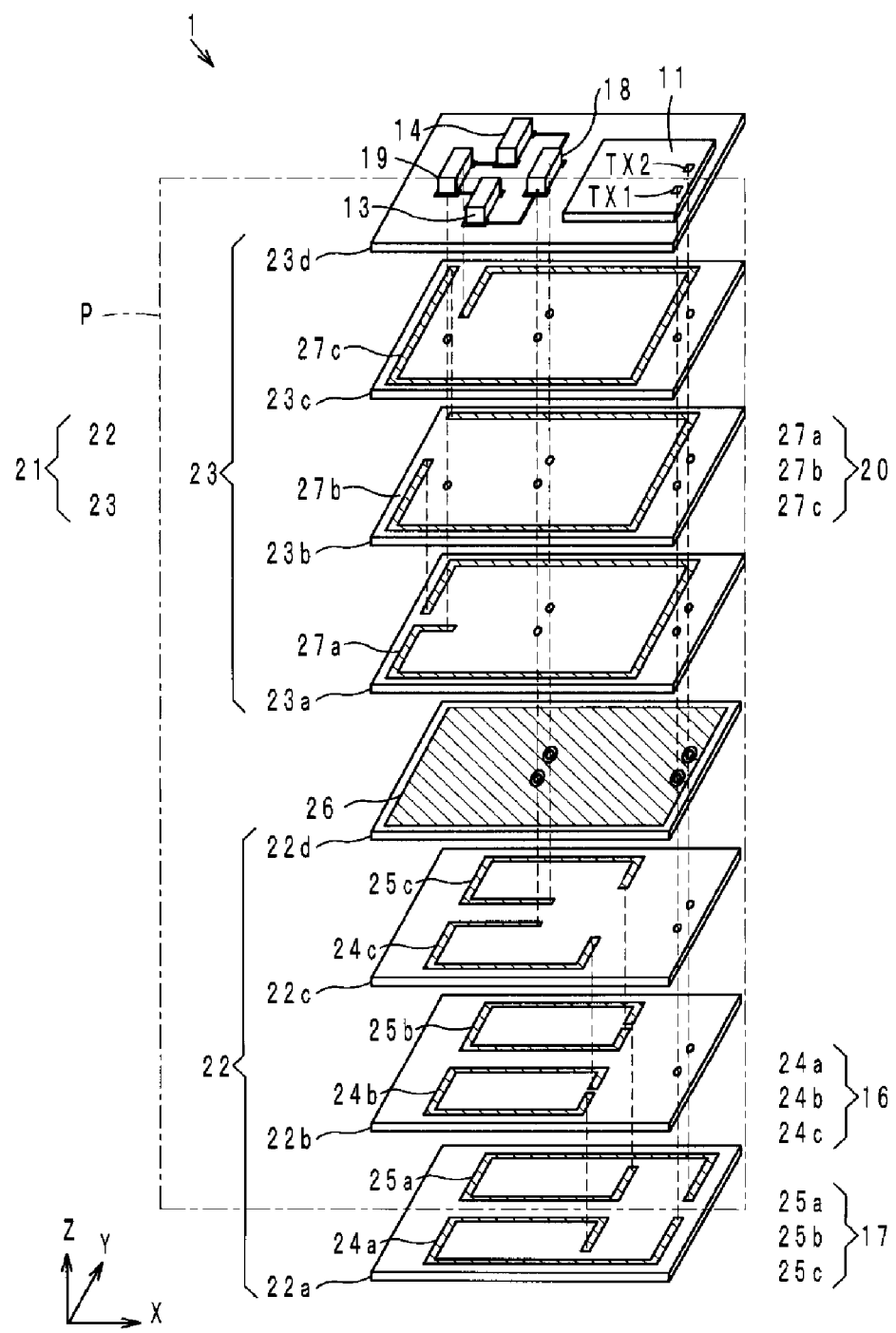
FIG. 2 is an exploded perspective view of a RW module according to a preferred embodiment of the present invention.

Next, referring to FIG. 2, a configuration of the RW module 1 of FIG. 1 is described in detail. In FIG. 2, the same reference symbols denote elements corresponding to ones illustrated in FIG. 1. Further, an X axis, a Y axis, and a Z axis are axes perpendicular or substantially perpendicular to each other. In particular, the Z axis is parallel or substantially parallel to a direction along which magnetic layers 22a to 22d and non-magnetic layers 23a to 23d are stacked up. The magnetic layers 22a to 22d and the non-magnetic layers 23a to 23d will be described below. For convenience of description, it is assumed that a top of page in FIG. 2 corresponds to a top side of the stacking direction. Further, the X axis is parallel or substantially parallel to top surfaces of the magnetic layers 22a to 22d and the non-magnetic layers 23a to 23d, which will be described below. For convenience of description, it is assumed that the X axis corresponds to a right-and-left direction of the RW module 1.

The RW module 1 includes a rectangular or substantially rectangular solid shape multilayer structure 21, the first and second inductor elements 16 and 17, and the antenna coil 20.

Further, as a preferable configuration, the RW module 1 preferably further includes a shield conductor 26.

The multilayer structure 21 preferably includes a magnetic block 22 and a non-magnetic block 23. In the present preferred embodiment, the non-magnetic block 23 is stacked above the magnetic block 22. Here, in the following description, a plane (denoted by a dashed-dotted line) that perpendicularly bisects the multilayer structure 21 with respect to the Y axis is defined as a center plane P.

The magnetic block 22 preferably includes four magnetic layers 22a to 22d that are stacked from bottom to top, for example. The magnetic layers 22a to 22d each have a rectangular or substantially rectangular sheet shape in top surface view, and are each defined by a magnetic material (for example, ferrite or the like) having a relatively high magnetic permeability. Although details are described below, the magnetic material having a high magnetic permeability is used here in order to define closed magnetic paths of magnetic fluxes generated by the first and second inductor elements 16 and 17.

The non-magnetic block 23 preferably includes four non-magnetic layers 23a to 23d that are stacked from bottom to top. The non-magnetic layer 23a is stacked directly above the magnetic layer 22d. The non-magnetic layers 23a to 23d each preferably have the same or substantially the same shape as the magnetic layer 22a in top surface view, and are each preferably made of a material having a relatively low magnetic permeability. Although details are described below, the material having a low magnetic permeability preferably is used in order to radiate a high frequency signal from the antenna coil 20.

First, the RW-IC chip 11 is mounted on a top surface of the multilayer structure 21 (top surface of the non-magnetic layer 23d) that is configured as described above. The RW-IC chip 11 includes output terminals Tx1 and Tx2 defined by metal conductors. The output terminals Tx1 and Tx2 are arranged on a bottom surface of the RW-IC chip 11 with a gap between them. By using via-holes and the output terminals Tx1 and Tx2, the RW-IC chip 11 is mounted in such a way that the output terminals Tx1 and Tx2 are arranged symmetrically about the center plane P.

The first and second inductor elements 16 and 17 have shapes that are symmetric to each other about the center plane P. The first inductor element 16 preferably includes three first coil patterns 24a to 24c. The first coil patterns 24a to 24c are preferably formed on respective top surfaces of the magnetic layers 22a to 22c by, for example, etching processing or the like. Further, the first coil pattern 24a to 24c each preferably include a metal conductor, and each define a loop conductor looped about a winding axis that is parallel or substantially parallel to the Z axis.

One end of the first coil pattern 24a is connected to the one output terminal Tx1 through a via-hole formed through the magnetic layers 22b to 22d and the non-magnetic layers 23a to 23d. No reference symbol is used to denote each via-hole, for FIG. 2 would become too complicated if all via-holes are denoted by reference symbols.

Further, one end of the first coil pattern 24b is connected to the other end of the first coil pattern 24a through a via-hole (not illustrated) provided at the magnetic layer 22b. One end of the first coil pattern 24c is connected to the other end of the first coil pattern 24b through a via-hole (not illustrated) provided at the magnetic layer 22c. Further, the other end of the first coil pattern 24c is connected to one of the terminal electrodes of the capacitor element 18 through a via-hole formed through the magnetic layer 22d and the non-magnetic layers 23a to 23d.

Further, the second inductor element 17 preferably includes three first coil patterns 25a to 25c that each include a metal conductor and are symmetric to the first coil patterns 24a to 24c about the center plane P. The first coil patterns 25a to 25c preferably are formed on respective top surfaces of the magnetic layers 22a to 22c by, for example, etching processing or the like. Further, the first coil pattern 25a to 25c each preferably include a metal conductor, and each define a loop conductor looped about a winding axis that is parallel or substantially parallel to the Z axis.

One end of the first coil pattern 25a is connected to the other output terminal Tx2 through a via-hole formed through the magnetic layers 22b to 22d and the non-magnetic layers 23a to 23d. One end of the first coil pattern 25b is connected to the other end of the first coil pattern 25a through a via-hole (not illustrated) provided at the magnetic layer 22b. One end of the first coil pattern 25c is connected to the other end of the first coil pattern 25b through a via-hole (not illustrated) formed at the magnetic layer 22c. Further, the other end of the first coil pattern 25c is connected to the other terminal electrode of the capacitor element 18 through a via-hole formed through the magnetic layer 22d and the non-magnetic layers 23a to 23d.

In addition to the RW-IC chip 11, the first and second capacitor elements 13 and 14, the capacitor element 18, and the tuning capacitor element 19 are mounted on the top surface of the multilayer structure 21. The first and second capacitor elements 13 and 14 are arranged on the top surface of the multilayer structure 21 so as to be symmetric to each other about the center plane P. The capacitor element 18 includes one electrode and another electrode, and is mounted so that these one and another electrode are symmetric to each other about the center plane P. The tuning capacitor element 19 also includes one electrode and another electrode, and is mounted so that the one and another electrode are symmetric to each other about the center plane P. These capacitor elements 13, 14, 18, and 19 are connected as illustrated in FIG. 1. When the electronic components such as the RW-IC chip 11 and the like are mounted on the top surface of the multilayer structure 21 as described above, no additional space is needed to secure at any other portion to mount these electronic components. Thus, it is preferable from a space-saving point of view.

Now, the shield conductor 26 is described. As described above, the magnetic layer 22d is stacked directly above the magnetic layer 22c. On the top surface of the magnetic layer 22d, the shield conductor 26 including a metal conductor preferably is formed by, for example, etching or the like. The shield conductor 26 has an area large enough to cover the first and second inductor elements 16 and 17 in top surface view. It should be noted that, as described above, preferably there are several via-holes provided at the magnetic layer 22d. Thus, the shield conductor 26 is configured so as not to establish electrical continuity with other conductors such as the via-holes and the like or so as to be connected to a ground that is not illustrated. Although details are described below, the shield conductor 26 is provided to prevent the antenna coil 20 and the first and second inductor elements 16 and 17 from forming mutual magnetic coupling.

The antenna coil 20 preferably includes three second coil patterns 27a to 27c. The second coil patterns 27a to 27c preferably are formed on respective top surfaces of the non-magnetic layers 23a to 23c by, for example, etching processing or the like. Further, the second coil pattern 27a to 27c each preferably include a metal conductor, and define a loop conductor looped about a winding axis that is parallel or substantially parallel to the Z axis. Further, the second coil pattern 27a to 27c are each arranged so as to overlap the first and second inductor elements 16 and 17 in a planar view along the Z axis direction.

One end of the second coil pattern 27a is connected to one of the electrodes of the tuning capacitor element 19 through a via-hole formed through the non-magnetic layers 23b to 23d. One end of the second coil pattern 27b is connected to the other end of the second coil pattern 27a through a via-hole (not illustrated) provided at the non-magnetic layer 23b. Further, one end of the second coil pattern 27c is connected to the other end of the second coil pattern 27b through a via-hole (not illustrated) provided at the non-magnetic layer 23c. The other end of the second coil pattern 27c is connected to the other electrode of the tuning capacitor element 19 through a via-hole (not illustrated) provided at the non-magnetic layer 23d.

Figure 3:
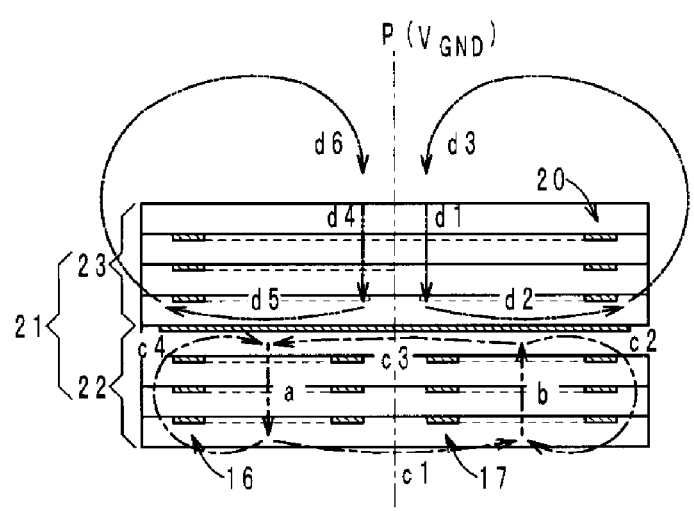
FIG. 3 is a side view of a RW module and a schematic diagram illustrating respective magnetic fluxes generated by an antenna coil, a first inductor element, and a second inductor element.

Next, referring to FIG. 3, an operation and effects of the RW module 1 of FIG. 1 and FIG. 2 is described in detail. As described above, the first and second inductor elements 16 and 17 receive input of the non-inverted signal and the inverted signal. Further, winding directions of the first and second inductor elements 16 and 17 are opposite to each other. Thus, magnetic fluxes that penetrate the first and second inductor elements 16 and 17 are in opposite directions as denoted by arrows a and b of FIG. 3. Further, the first and second inductor elements 16 and 17 are arranged in close proximity within the multilayer structure 21. Thus, the magnetic fluxes generated by the first and second inductor elements 16 and 17 also penetrate the second and first inductor elements 17 and 16, respectively. In other words, the first and second inductor elements 16 and 17 are magnetically coupled with each other.

Further, the first and second inductor elements 16 and 17 are provided inside the magnetic block 22. Thus, the magnetic fluxes respectively generated at the first and second inductor elements 16 and 17 define closed magnetic paths within the magnetic block 22 as denoted by arrows c1 to c4. Thus, these magnetic fluxes do not penetrate the antenna coil 20 arranged above the first and second inductor elements 16 and 17 in close proximity. As a result, in effect, no magnetic coupling is formed between the antenna coil 20 and the first and second inductor elements 16 and 17.

Accordingly, as described above, no induced electromotive force is generated in the antenna coil 20 due to the magnetic coupling with the first and second inductor elements 16 and 17 even when the antenna coil 20 and the first and second inductor elements 16 and 17 are arranged in close proximity inside the same multilayer structure 21. In other words, the antenna coil 20 is driven only by the outputted differential signal from the LPF 12, and radiates a high frequency signal including no harmonic component as denoted by arrows d1 to d6. Accordingly, the present preferred embodiment provides the small RW module 1 (wireless communication module) having excellent high frequency characteristics.

Further, the shield conductor 26 is disposed between the antenna coil 20 and the first and second inductor elements 16 and 17. An eddy current starts to flow inside the shield conductor 26 when the magnetic flux from the antenna coil 20 tries to penetrate through the shield conductor 26. As a result, a magnetic flux in the opposite direction is generated and cancels the magnetic flux from the antenna coil 20. Here, the magnetic layer 22d is disposed between the shield conductor 26 and the first and second inductor elements 16 and 17. Thus, the magnetic fluxes from these do not, in effect, penetrate the shield conductor 26. This makes it possible to significantly reduce or prevent more successfully the magnetic coupling between the antenna coil 20 and the first and second inductor elements 16 and 17, and to provide the RW module 1 (wireless communication module) having more excellent high frequency characteristics.

Further, in a preferable example, the RW-IC chip 11 including the balance-type output terminals Tx1 and Tx2 is mounted on the top surface of the RW module 1, and the differential signal is transmitted to the antenna circuit 15. Specifically, the first inductor element 16 is connected in series to the one output terminal Tx1. Further, the second inductor element 17, which is configured symmetrically and arranged in close proximity to the first inductor element 16, is connected in series to the other output terminal Tx2. As described above, the magnetic fluxes generated by the first and second inductor elements 16 and 17 define the closed magnetic paths inside the magnetic block 22. This makes it possible to provide the RW module 1 (wireless communication module) having more excellent high frequency characteristics. Further, the first and second inductor elements 16 and 17 define a common mode choke and remove common mode noise. This achieves signal transmission that is highly tolerant to noise or the like.

In the foregoing preferred embodiments, as a preferable example, the first and second inductor elements 16 and 17 are arranged inside the magnetic block 22 so as to define the closed magnetic paths. However, in order to prevent the first and second inductor elements 16 and 17 from forming substantive magnetic coupling with the antenna coil 20, at least one magnetic layer 22 (the magnetic layer 22d in the example of FIG. 2) is preferably present between the antenna coil 20 and the first and second inductor elements 16 and 17.

Further, in the foregoing preferred embodiments, as a preferable example, the first and second inductor elements 16 and 17 are arranged inside the magnetic block 22 so as to define the closed magnetic paths, and the shield conductor 26 is present between the antenna coil 20 and the first and second inductor elements 16 and 17. However, the RW module 1 may include only a feature that the first and second inductor elements 16 and 17 are arranged inside the magnetic block 22 so as to define the closed magnetic paths, or a feature that the shield conductor 26 is present between the antenna coil 20 and the first and second inductor elements 16 and 17. As described above, either one of the features is capable of significantly reducing or preventing the magnetic coupling between the antenna coil 20 and the first and second inductor elements 16 and 17.

In the foregoing preferred embodiments, as a preferable example, the RW-IC chip 11 is mounted on the top surface of the multilayer structure 21. Alternatively, the RW-IC chip 11 may be mounted on another circuit board or built in the multilayer structure 21.

Further, in the foregoing preferred embodiments, the RW-IC chip 11 is described as including the balance-type output terminals Tx1 and Tx2. Alternatively, a RW-IC chip including unbalanced type output terminals including a signal terminal and a ground terminal may be mounted on the multilayer structure 21. In this case, only one inductor element is required in the LPF 12. Specifically, the LPF 12 may include an inductor element that is connected in series between the signal terminal and the antenna circuit, and no inductor element is required between the ground terminal and the antenna circuit.

Further, in the foregoing preferred embodiments, an example is described in which the LPF 12 is disposed at a previous stage of the antenna circuit 15. Alternatively, instead of the LPF 12, a matching circuit may be connected at the previous stage of the antenna circuit. The matching circuit may include at least one inductor element and perform impedance matching between the antenna circuit 15 and the RW-IC chip 11.

Further, in the foregoing preferred embodiments, the antenna coil 20 preferably includes a plurality of non-magnetic layers 23a to 23d. Alternatively, the antenna coil (more specifically, a planar antenna coil) may be provided by using a single non-magnetic layer or one surface of a plate-shaped non-magnetic block.

Below, referring to FIG. 4, a RW module 1a that serves as a first modification example of the RW module 1 is described.

Figure 4:
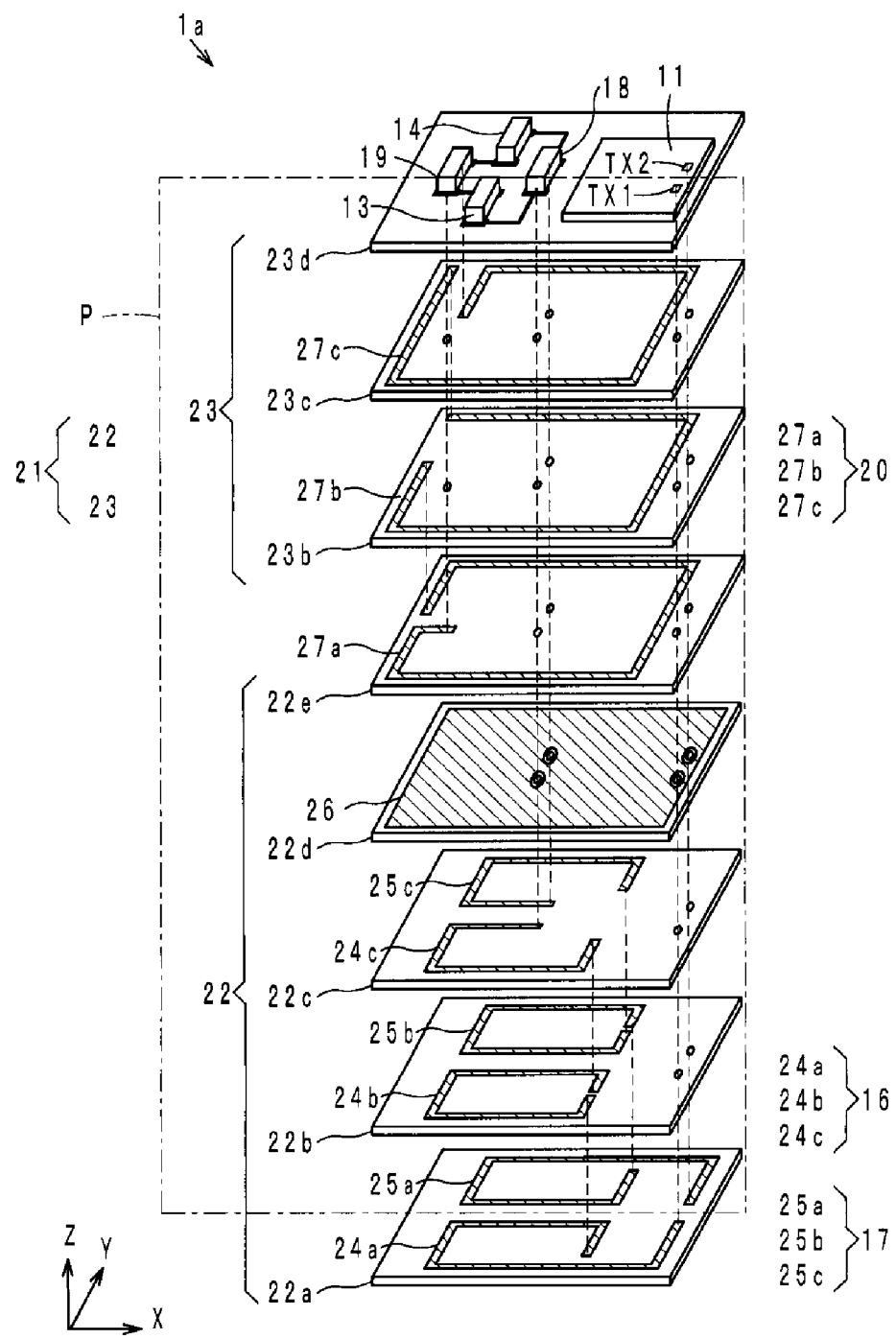
FIG. 4 is an exploded perspective view of a RW module according to a first modification example of a preferred embodiment of the present invention.

In FIG. 4, compared with the foregoing RW module 1, the RW module 1a is different in that the non-magnetic layer 23a is replaced by a magnetic layer 22e. Specifically, the magnetic block 22 preferably includes five magnetic layers 22a to 22e that are stacked from bottom to top. The magnetic layers 22a to 22e each preferably have a rectangular or substantially rectangular sheet shape in top surface view, and each preferably include a magnetic material having a relatively high magnetic permeability so as to define closed magnetic paths of magnetic fluxes generated by the first and second inductor elements 16 and 17. Further, the non-magnetic block 23 includes non-magnetic layers 23b to 23d. There is no other difference between the RW module 1 and the RW module 1a. Thus, in FIG. 4, the same reference symbols denote elements corresponding to ones illustrated in FIG. 2, and descriptions thereof are omitted.

The foregoing configuration makes is possible to locate the magnetic layer 22e between the antenna coil 20 and the shield conductor 26. This configuration allows a magnetic flux generated at the antenna coil 20 to pass inside the magnetic layer 22e and define a closed magnetic path. In other words, in the first modification example, it becomes more difficult for the magnetic flux of the antenna coil 20 to pass through the shield electrode 26. This makes it difficult to provide linkages between the magnetic field generated at the antenna coil 20 and current loops flowing through the first and second inductor elements 16 and 17. Thus, the magnetic coupling between them is further reduced. Further, a demagnetizing field, which is generated when the magnetic flux penetrates the shield conductor 26, is reduced. Thus, a communication range of the antenna coil 20 is significantly extended.

Below, referring to FIG. 5, a RW module 1b that serves as a second modification example of the RW module 1 is described.

Figure 5:
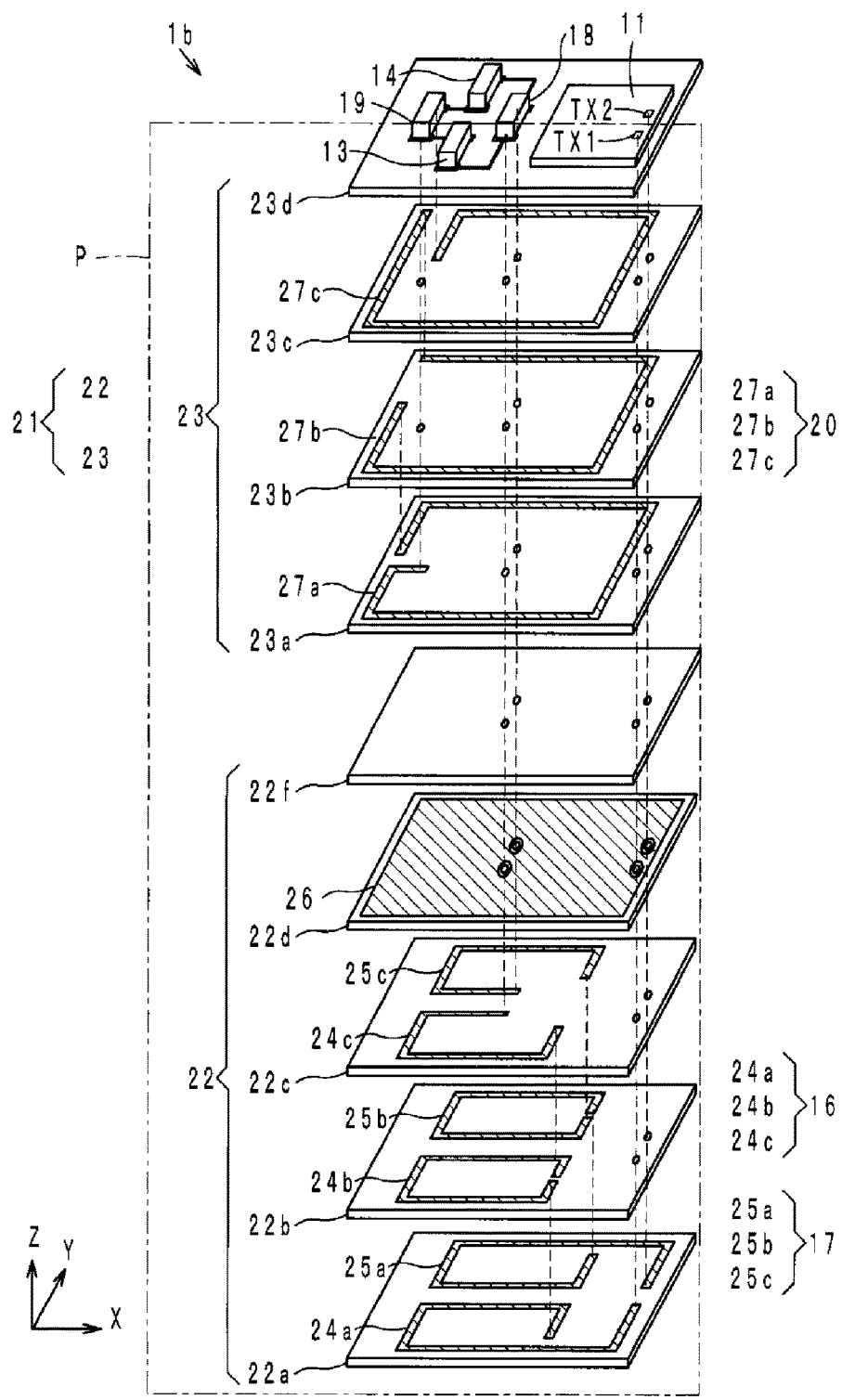
FIG. 5 is an exploded perspective view of a RW module according to a second modification example of a preferred embodiment of the present invention.

In FIG. 5, compared with the foregoing RW module 1, the RW module 1b is different in that the magnetic block 22 further includes a magnetic layer 22f. Specifically, the magnetic block 22 preferably includes five magnetic layers 22a to 22d and 22f that are stacked from bottom to top. The magnetic layers 22a to 22d and 22f each preferably have a rectangular or substantially rectangular sheet shape in top surface view, and each preferably include a magnetic material having a relatively high magnetic permeability. Here, in the present modification example, the non-magnetic block 23 preferably includes non-magnetic layers 23a to 23d, as is the case with the foregoing preferred embodiments. There is no other difference between the RW module 1 and the RW module 1b. Thus, in FIG. 5, the same reference symbols denote elements corresponding to ones illustrated in FIG. 2, and descriptions thereof are omitted.

The foregoing configuration makes it possible to locate the magnetic layer 22f between the antenna coil 20 and the shield conductor 26. Thus, the operation and effects similar to those of the first modification example may be achieved.

Below, referring to FIG. 6, a RW module 1c that serves as a third modification example of the RW module 1 is described.

Figure 6:
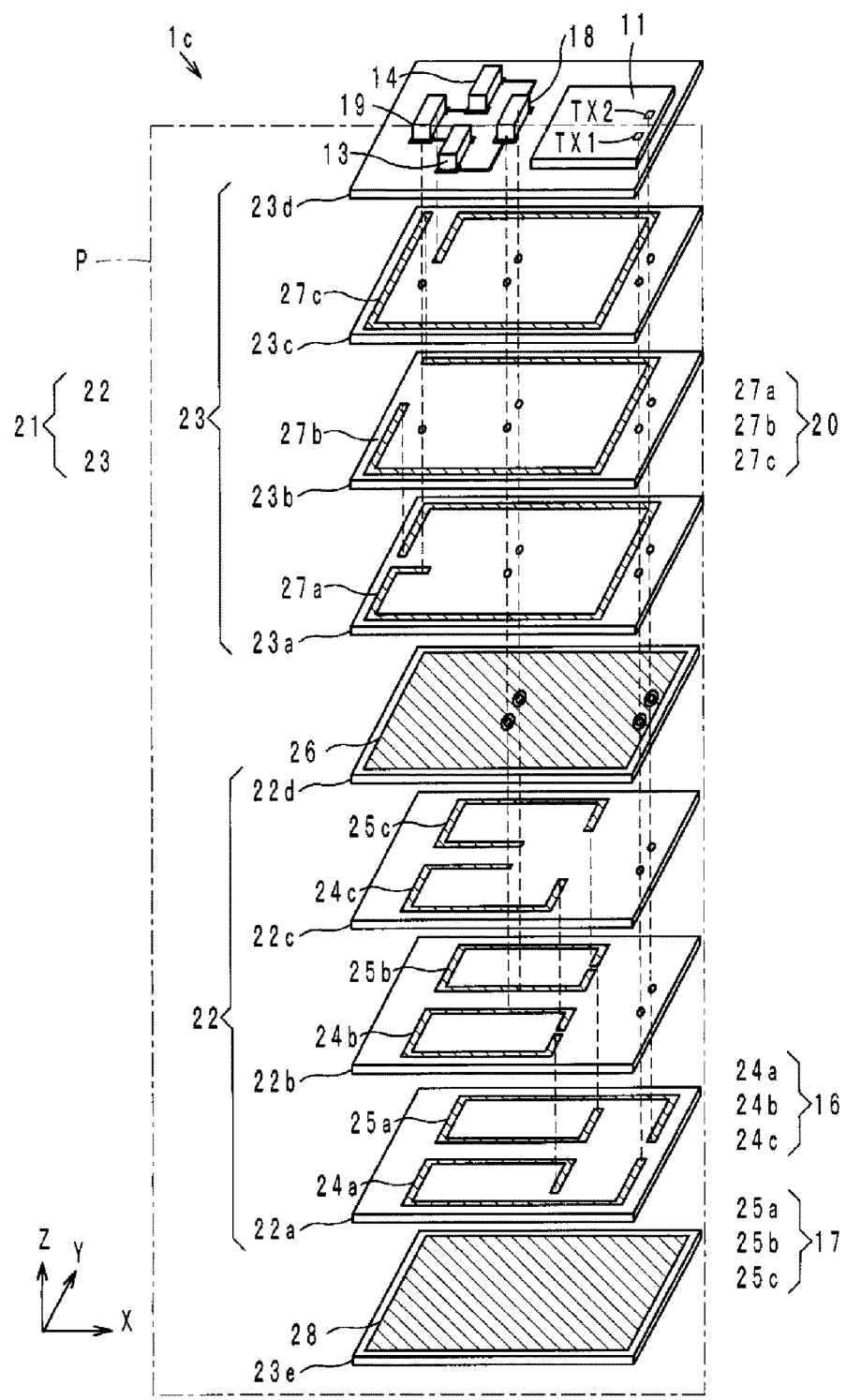
FIG. 6 is an exploded perspective view of a RW module according to a third modification example of a preferred embodiment of the present invention.

In FIG. 6, compared with the foregoing RW module 1, the RW module 1c is different in that the RW module 1c further includes a non-magnetic layer 23e and a second shield conductor 28. Specifically, the non-magnetic layer 23e preferably has a rectangular or substantially rectangular sheet shape of the same size as the non-magnetic layer 23d and the like in top surface view, and may include, for example, a material having the same low magnetic permeability as that of the non-magnetic layer 23d and the like. This non-magnetic layer 23e is stacked below the magnetic layer 22a. The second shield conductor 28 may include, for example, a metal conductor, and may be formed on a top surface of the non-magnetic layer 23e by, for example, etching or the like. The shield conductor 28 has an area large enough to cover the first and second inductor elements 16 and 17 in a top surface view. As is the case with the shield conductor 26, the shield conductor 28 is also electrically insulated so as not to establish electrical continuity with other conductors such as via-holes and the like. There is no other difference between the RW module 1 and the RW module 1c. Thus, in FIG. 6, the same reference symbols denote elements corresponding to ones illustrated in FIG. 2, and descriptions thereof are omitted.

As is clear from the following description of an application example, there is a case where the RW module 1c such as the modules described above may be mounted on a printed wiring board 72 (see FIG. 8A, for example) by using a bottom surface side of the non-magnetic layer 23e. Specifically, an electronic circuit provided at the RW module 1c is connected to a wiring pattern located on the printed wiring board 72 or the like. Further, in most cases, the printed wiring board 72 is provided with a ground conductor.

If the shield conductor 28 is not provided in the RW module 1c, there may be a case where the ground conductor of the printed wiring board 72 is arranged in close proximity of the first and second inductor elements 16 and 17 and generates unwanted coupling due to stray capacitance.

However, as in the present modification example, separating the ground conductor from the first and second inductor elements 16 and 17 with the shield conductor 28 limits the formation of electric field between them. This makes it possible to significantly reduce or prevent the formation of unwanted coupling between the ground conductor of the printed wiring board 72 and the first and second inductor elements 16 and 17 due to the stray capacitance, and significant reduce effects on the first and second inductor elements 16 and 17.

Further, as described above, a topmost layer (namely, non-magnetic layer 23d) and a bottommost layer (namely, non-magnetic layer 23e) of the RW module 1c may be made of the same material. This configuration significantly reduces or prevents changes in shape of the RW module 1c (for example, warping or cracking) due to ambient temperature changes.

Below, referring to FIG. 7, a RW module 1d that serves as a fourth modification example of the RW module 1 is described.

Figure 7:
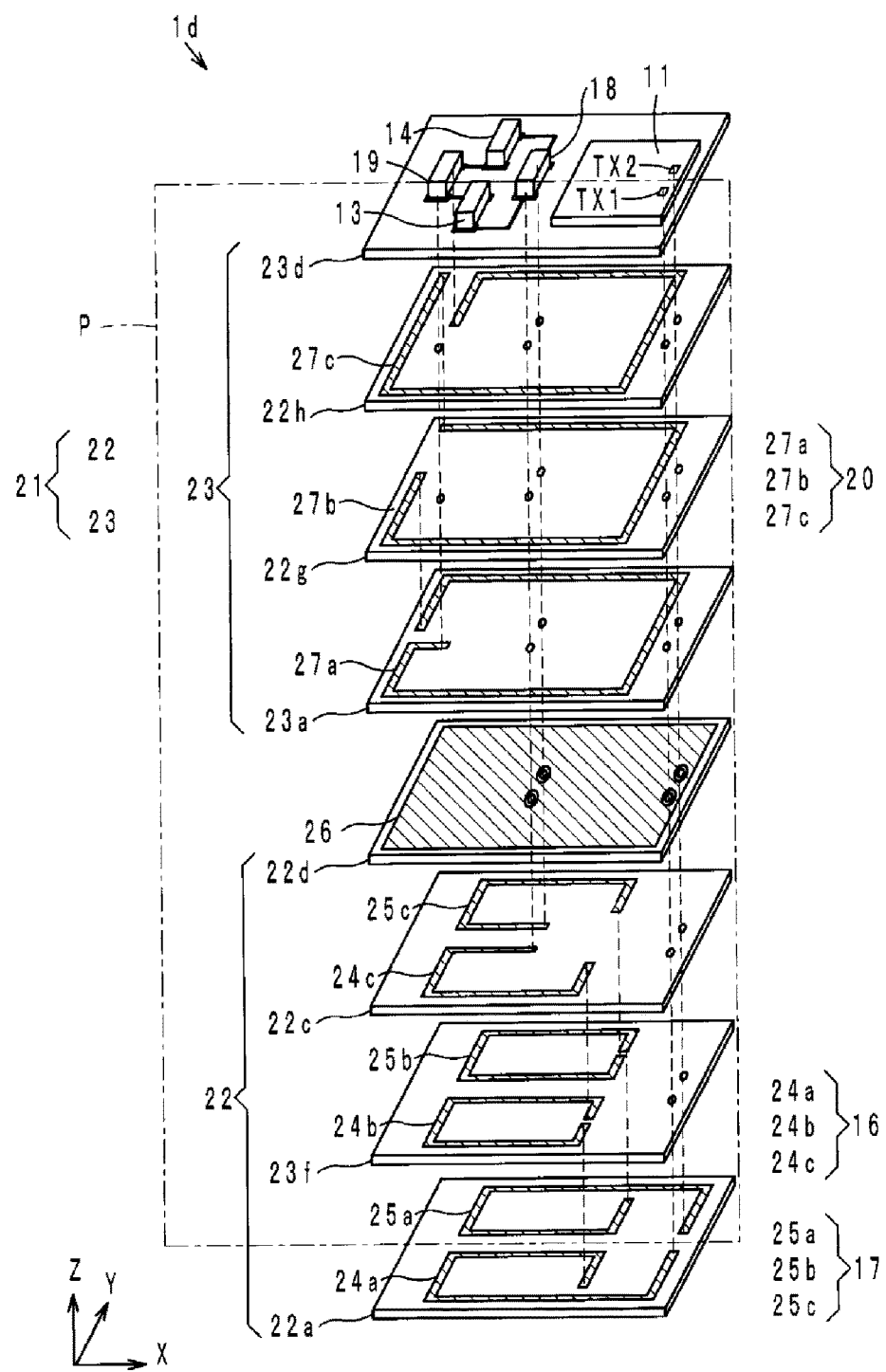
FIG. 7 is an exploded perspective view of a RW module according to a fourth modification example of a preferred embodiment of the present invention.

In FIG. 7, compared with the foregoing RW module 1, the RW module 1d is different in that the magnetic layer 22b is replaced by a non-magnetic layer 23f and the non-magnetic layers 23b and 23c are replaced by magnetic layers 22g and 22h. There is no other difference between the RW module 1 and the RW module 1d. Thus, in FIG. 7, same reference symbols denote elements corresponding to ones illustrated in FIG. 2, and descriptions thereof are omitted.

The non-magnetic layer 23f preferably has a rectangular or substantially rectangular sheet shape of the same size as the non-magnetic layer 23d and the like in top surface view, and preferably includes, for example, a material having the same low magnetic permeability as that of the non-magnetic layer 23d and the like. The magnetic layers 22g and 22h each preferably have a rectangular or substantially rectangular sheet shape of the same size as the magnetic layer 22a and the like in a top surface view, and each preferably include, for example, a material having the same high magnetic permeability as that of the magnetic layer 22a and the like.

The foregoing RW module 1d increases the inductance value of the antenna coil 20 since the magnetic layers 22g and 22h are provided in the non-magnetic block 23. Further, direct current superimposition characteristics of the first and second inductor elements 16 and 17 may be improved since the non-magnetic layer 23d is provided in the magnetic block 22.

Below, referring to FIG. 8A to FIG. 9B, a communication terminal apparatus 7 that serves as an application example of the RW module 1 is described in detail.

Figure 8A:
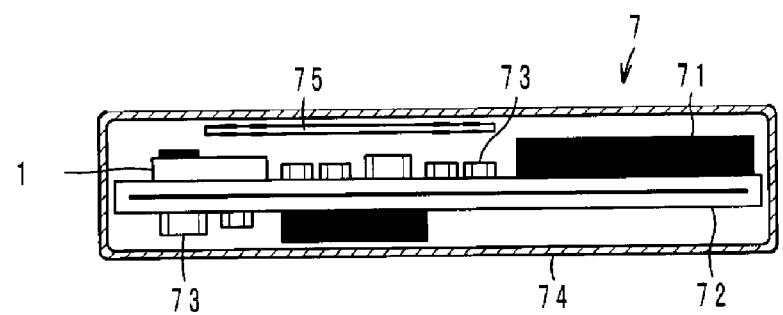
FIG. 8A is a schematic diagram illustrating an internal configuration of communication terminal apparatus.

The communication terminal apparatus 7 preferably is a cellular phone in a typical case, and includes, at least, a battery pack 71 and various electronic components 73 mounted on the printed wiring board 72 within a casing 74, as illustrated in FIG. 8A.

Figure 8B:
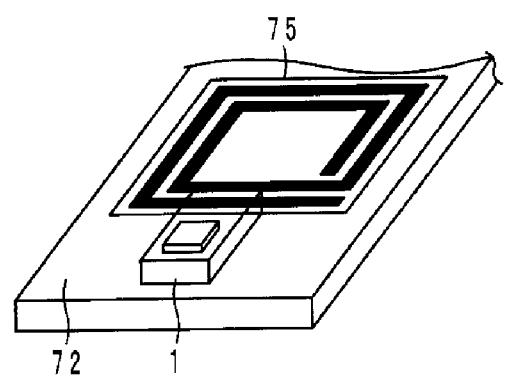
FIG. 8B is an enlarged view of a RW module and a booster antenna.

As illustrated in FIG. 8B, for example, the RW module 1 described in the present preferred embodiment is mounted on the printed wiring board 72 as one of the various electronic components 73. However, the various electronic components 73 and the like for a cellular phone are densely packed inside the casing 74. Thus, strict constraints are applied to the size and location of the RW module 1. Therefore, it is preferable to downsize the RW module 1. To downsize the RW module 1, it is necessary to downsize, for example, the antenna coil 20. However, when the antenna coil 20 is downsized, there is a problem that the communication range of the RW module 1 becomes shorter and the like. Thus, the communication terminal apparatus 7 further includes a booster antenna 75 having a larger size opening than that of the antenna coil 20. The booster antenna 75 is provided as an independent unit separated from the RW module 1.

Figure 9A:
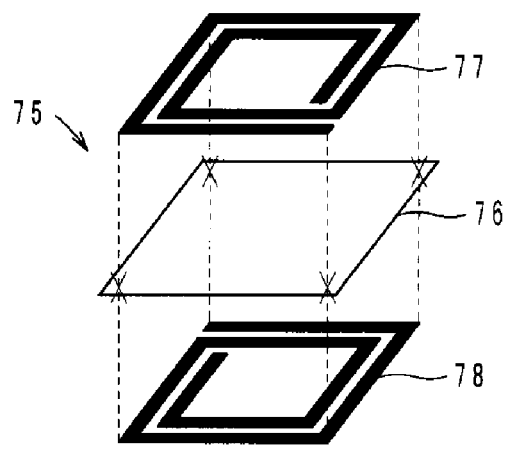
FIG. 9A is a schematic diagram illustrating a configuration of booster antenna.
Figure 9B:
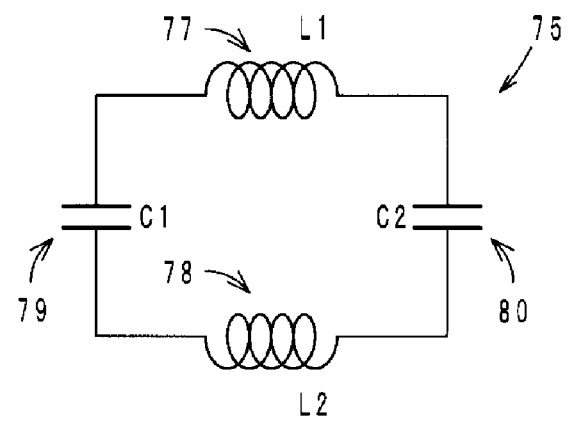
FIG. 9B is an equivalent circuit diagram of a booster antenna.

In the booster 75, as illustrated in FIG. 9A, first and second antenna coils 77 and 78 wound in directions opposite to each other are provided on a top surface and a back surface of a base sheet 76 including a dielectric material or a magnetic material. Further, as illustrated in an equivalent circuit of FIG. 9B, the first and second antenna coils 77 ad 78 are connected to each other through capacitors 79 and 80. A resonance frequency of the booster antenna 75 is determined by inductance values of both the antenna coils 77 and 78 and capacitance values of both the capacitors 79 and 80.

The booster antenna 75 configured as described above is arranged inside the casing 74 so as to magnetically couple with the antenna coil 20 of the RW module 1, and functions as follows. When a differential signal is supplied to the antenna coil 20, an induced magnetic field is generated around the antenna coil 20. When this magnetic field penetrates respective antenna coils 77 and 78 of the booster antenna 75, induced currents flow through the respective antenna coils 77 and 78, and the antenna coil 20 magnetically couples with the booster antenna 75. Further, the induced current flow in the booster antenna 75 causes the booster antenna 75, which has a relatively large coil opening, to generate a magnetic field, thus making it possible to extend the communication range.

Here, the booster antenna 75 may be made thinner than the RW module 1, and may be able to receives power through the magnetic coupling with the RW module 1 without using any pin or wiring. Thus, the booster antenna 75 may be arranged at a narrow space inside the casing 74. Using such a booster antenna 75 allows to increase flexibility in arranging the RW module 1 and further enables to downsize the antenna coil 20.

As described above, the application example not only achieves the operation and effects similar to those in the preferred embodiments, but also enables the communication terminal apparatus 7 to secure the communication range while downsizing the antenna coil 20 by use of the booster antenna 75.

The wireless communication module according to various preferred embodiments and modification examples thereof of the present invention and the communication terminal apparatus including such a wireless communication module produce an effect that the unwanted harmonic radiation is significantly reduced or prevented, and are useful for cellular phones and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A communication terminal apparatus comprising:
   an integrated circuit (IC) chip including first and second terminals, that executes a preset signal process;
   an antenna circuit including one end and another end, the one end being connected to the first terminal and the another end being connected to the second terminal; and
   a filter circuit including first and second inductor elements, the first inductor element being connected between the first terminal of the IC chip and the one end of the antenna circuit, and the second inductor element being connected between the second terminal of the IC chip and the another end of the antenna circuit; wherein
   the antenna circuit includes an antenna coil;
   the antenna coil and the first and second inductor elements are integrally provided in or on a multilayer structure, the multilayer structure including a magnetic block and at least one non-magnetic layer stacked on the magnetic block, the magnetic block including at least one magnetic layer;
   the first and second inductor elements are disposed at the magnetic block;
   the antenna coil is disposed at the non-magnetic layer; and
   the magnetic layer and the non-magnetic layer of the multilayer structure are disposed between the first and second inductor elements and the antenna coil.

2. The communication terminal apparatus according to claim 1, wherein
   the multilayer structure further includes a non-magnetic block, a plurality of the magnetic layers being stacked in the magnetic block, and a plurality of the non-magnetic layers being stacked in the non-magnetic block;
   the first and second inductor elements respectively include first coil patterns that are defined by the plurality of magnetic layers; and the antenna coil includes second coil patterns that are defined by the plurality of non-magnetic layers.

3. The communication terminal apparatus according to claim 2, further comprising a shield conductor disposed between the first and second inductor elements and the antenna coil.

4. The communication terminal apparatus according to claim 3, wherein at least one of the plurality of magnetic layers is disposed between the shield conductor and the first and second inductor elements.

5. The communication terminal apparatus according to claim 3, wherein at least one of the plurality of magnetic layers is disposed between the shield conductor and the antenna coil.

6. The communication terminal apparatus according to claim 2, wherein
the first and second inductor elements are arranged in close proximity to each other and include a plurality of first coil patterns that are respectively provided on the plurality of magnetic layers; and
the plurality of first coil patterns are each wound and arranged on a corresponding layer of the plurality of magnetic layers so that a magnetic flux passing through each of the first coil patterns defines a closed magnetic path.

7. The communication terminal apparatus according to claim 1, wherein the IC chip is mounted on the at least one non-magnetic layer of the multilayer structure.

8. The communication terminal apparatus according to claim 1, wherein the first and second terminal are balance terminals.

9. The communication terminal apparatus according to claim 1, further comprising a booster antenna that has a size larger than that of the antenna coil and is magnetically coupled with the antenna coil.

* * * * *